US010797670B2

(12) United States Patent
Knode et al.

(10) Patent No.: US 10,797,670 B2
(45) Date of Patent: Oct. 6, 2020

(54) AUDIO DEVICE WITH DYNAMICALLY RESPONSIVE VOLUME

(71) Applicant: Lutron Electronics Co., Inc., Coopersburg, PA (US)

(72) Inventors: Galen E. Knode, Macungie, PA (US); Chris Dimberg, Easton, PA (US)

(73) Assignee: Lutron Technology Company, LLC, Coopersburg, PA (US)

( * ) Notice: Subject to any disclaimer, the term of this patent is extended or adjusted under 35 U.S.C. 154(b) by 0 days.

(21) Appl. No.: 16/209,422

(22) Filed: Dec. 4, 2018

(65) Prior Publication Data
US 2019/0173446 A1 Jun. 6, 2019

Related U.S. Application Data

(60) Provisional application No. 62/594,295, filed on Dec. 4, 2017.

(51) Int. Cl.
H04R 29/00 (2006.01)
H03G 3/32 (2006.01)
H04R 3/00 (2006.01)
H03G 3/02 (2006.01)
H03G 3/30 (2006.01)
H03G 3/00 (2006.01)
H04R 27/00 (2006.01)

(52) U.S. Cl.
CPC ............ H03G 3/32 (2013.01); H03G 3/02 (2013.01); H03G 3/3005 (2013.01); H04R 3/00 (2013.01); H04R 29/001 (2013.01); H04R 27/00 (2013.01); H04R 2227/001 (2013.01); H04R 2227/003 (2013.01); H04R 2227/009 (2013.01); H04R 2430/01 (2013.01)

(58) Field of Classification Search
CPC .......... H03G 3/32; H03G 3/02; H03G 3/3005; H04R 3/00; H04R 29/001; H04R 27/00; H04R 2227/001; H04R 2227/003; H04R 2227/009; H04R 2430/01
USPC .......................................... 381/102–109, 57
See application file for complete search history.

(56) References Cited

U.S. PATENT DOCUMENTS

| 9,183,845 | B1 | 11/2015 | Gopalakrishnan et al. |
| 9,219,460 | B2 | 12/2015 | Bush |
| 9,225,307 | B2 | 12/2015 | Reilly et al. |
| 9,324,322 | B1 | 4/2016 | Torok et al. |
| 9,621,984 | B1 | 4/2017 | Chu |
| 9,693,164 | B1 | 6/2017 | Kadri et al. |
| 9,753,119 | B1 | 9/2017 | Velusamy et al. |
| 9,755,605 | B1 | 9/2017 | Li et al. |
| 2013/0279706 | A1* | 10/2013 | Marti ...................... G06F 3/165 381/57 |
| 2017/0242650 | A1* | 8/2017 | Jarvis .................. H04L 12/2803 |
| 2017/0242651 | A1* | 8/2017 | Lang ....................... G06F 3/165 |
| 2017/0358301 | A1 | 12/2017 | Tuomo et al. |

* cited by examiner

Primary Examiner — Ammar T Hamid
(74) Attorney, Agent, or Firm — Amy Yanek; Glen Farbanish; Philip Smith

(57) ABSTRACT

Described herein is an audio device with a microphone which may adapt the audio output volume of a speaker by either increasing or decreasing output volume based on an audio input volume from a user and a distance from the user to the audio device. The audio device may also adapt its output volume to lower the audio output based on detecting one or more interruptions including occupancy and acoustic sounds.

18 Claims, 6 Drawing Sheets

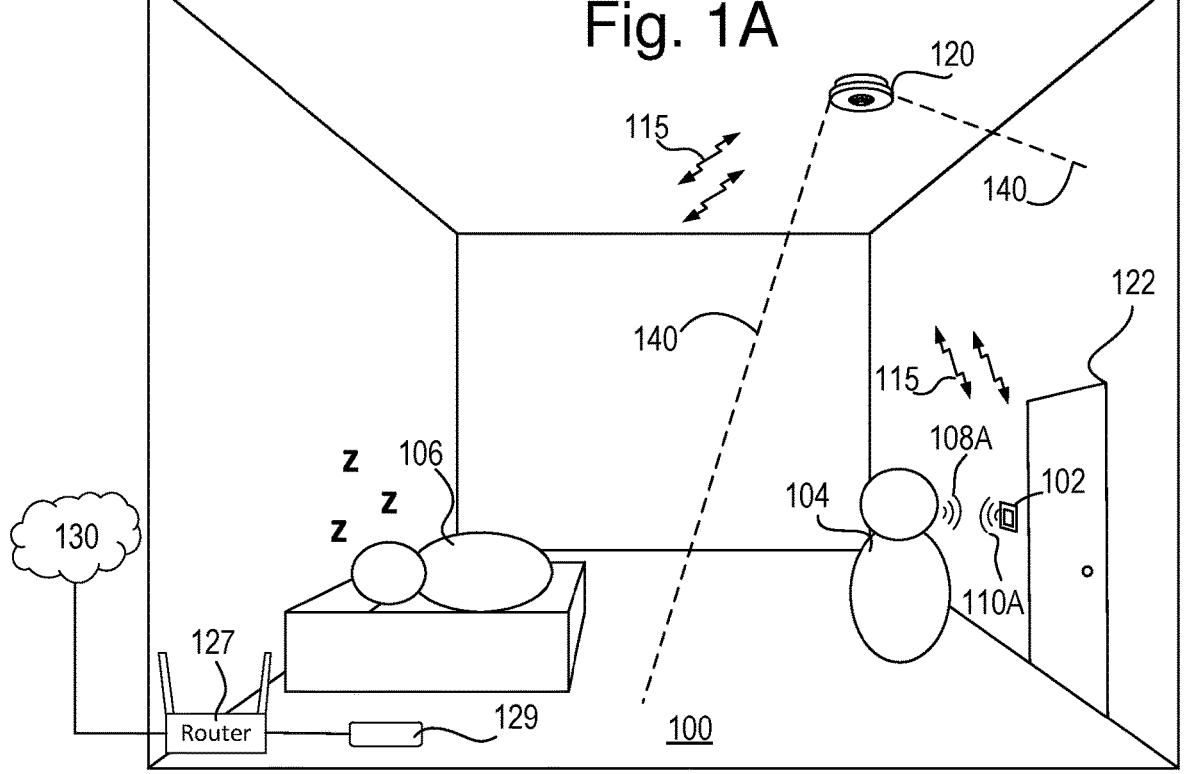
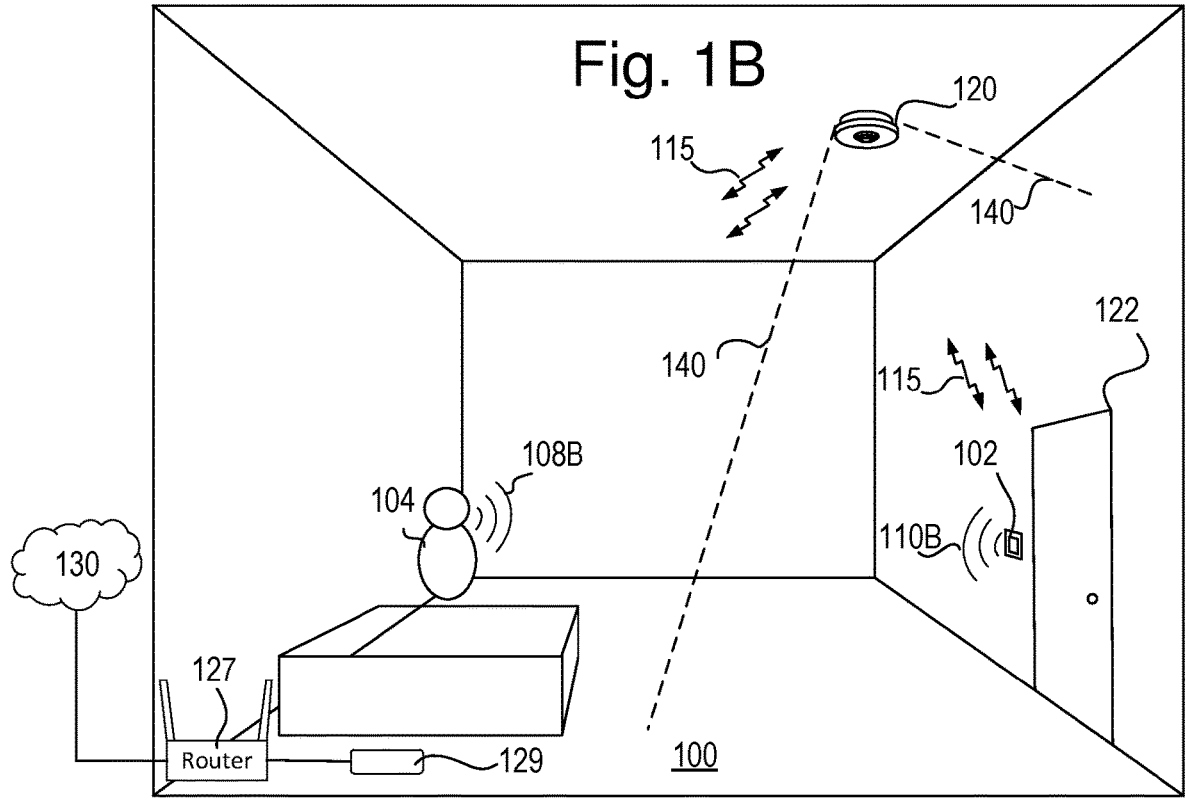

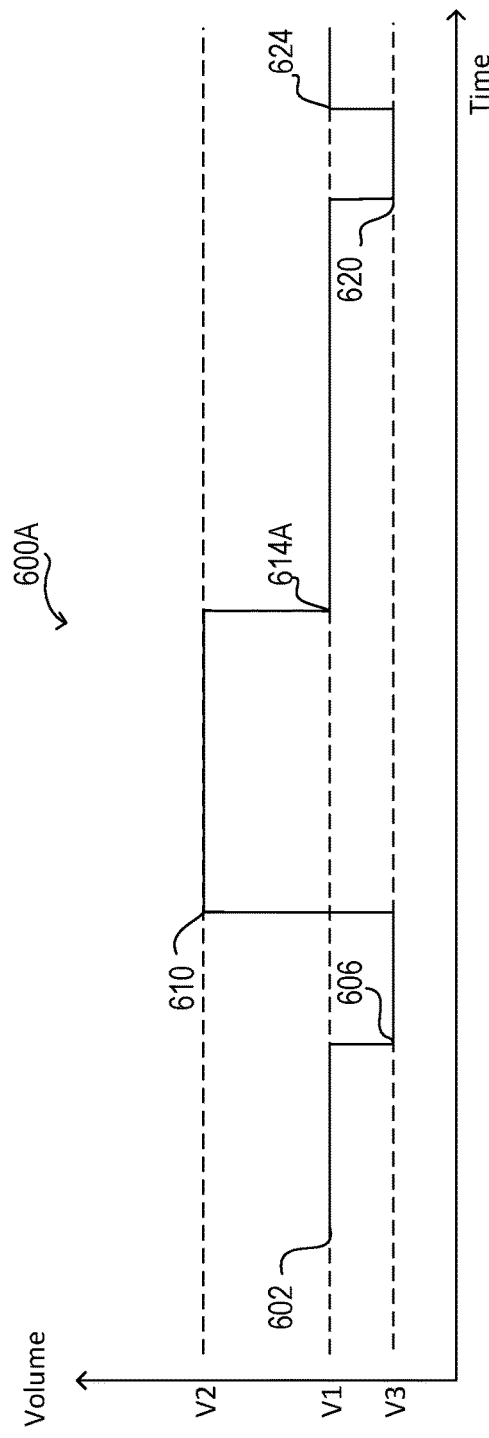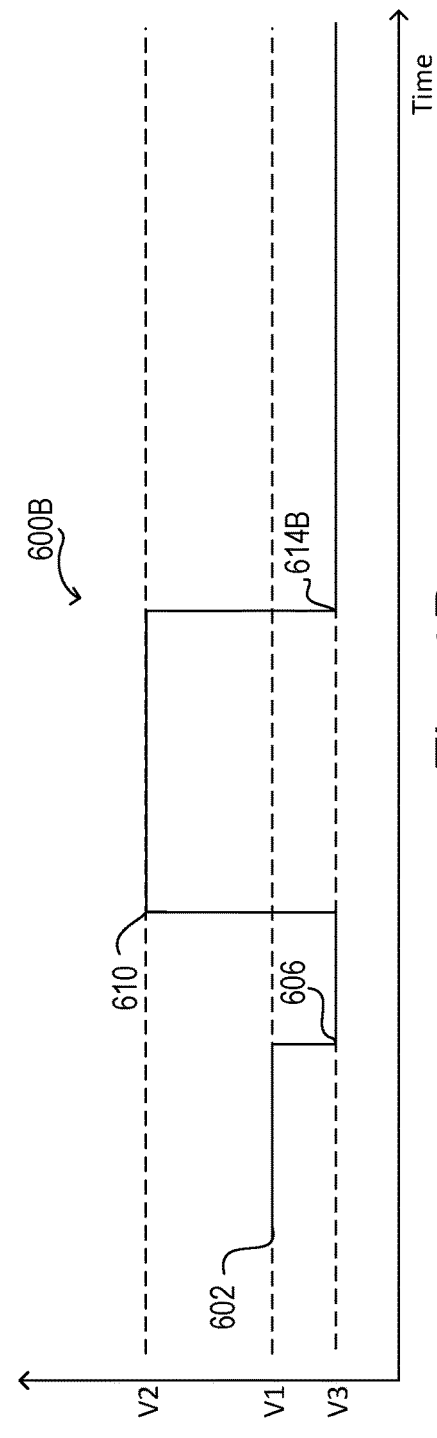

AUDIO DEVICE WITH DYNAMICALLY RESPONSIVE VOLUME

CROSS-REFERENCE TO RELATED APPLICATIONS

This application claims priority to Provisional U.S. Patent Application No. 62/594,295, filed Dec. 4, 2017, the entire disclosure of which is incorporated by reference herein.

BACKGROUND

Voice integration devices, also called voice assistants or audio devices (such as Amazon Echo or Google Home devices), allow a user to vocally interact with a connected microphone/speaker device. Voice integration devices may be used to control other devices in a home or business setting through the use of an activation keyword, or wake word, followed by a verbal command. For example, a user may integrate a voice integration device (e.g., Amazon Echo) with a lighting control system to control their lights through a keyword (e.g., "Alexa") followed by a user command (e.g., "turn on the living room light").

Voice integration devices are typically connected via a network to a cloud service that performs voice recognition on acoustic data contained in the user command. The voice integration device may transmit acoustic data to the network upon receiving the keyword. The network connection may be to an Internet router, and may be a wireless or wired connection. For example, the network connection may be a Wi-Fi or Ethernet connection to a user's Internet router. After the cloud service has interpreted the acoustic data, the voice integration device may then transmit device commands to other devices based on the interpretation of the acoustic data. The voice integration device may also respond verbally to the user to provide acknowledgement that the user command was received and/or to give the user confirmation that the device command was sent to the other devices.

One drawback of voice integration or audio devices is that using the audio device may disturb other users of the space, because the output volume of the audio device may be too loud. Voice integration devices may require a user to manually change the volume by pressing a button or turning a knob, or by verbally interacting with the device to request a change in volume. If this is not done, the volume level of the audio output may be undesirable in certain situations. For example, a user who quietly voices a request by whispering in close proximity to the audio device may receive a loud verbal acknowledgement (relative to the volume of the received voice request) from the audio device, which may disturb other users in the space.

Additionally, while a voice integration device may momentarily reduce the broadcast volume of music or podcasts to service a request based on receipt of a keyword from a user, current audio devices do not adjust their output volume based on other or additional audio input. For example, if a second person enters the room and starts talking to a first person while the audio device is playing a music track, it may be desirable for the audio device to reduce the output volume of the speaker so as to allow the second person to be more easily heard. Hence, there is a need for an audio device that is capable of dynamic volume adjustment based on conditions within the environment in which the audio device is located.

SUMMARY

An audio device with dynamically responsive volume may automatically adjust an output volume of one or more speakers of the audio device based on conditions within the environment within a space in which the audio device may be located. The conditions may include an ambient noise level of the space, a volume at which a user made a request, or a distance between the user and the audio device. In this way, a user making a verbal request to an audio device may receive a response from the audio device at a similar volume, or the response may be suppressed or muted. For example, for a user either in close proximity to the audio device, or making a request at a low volume (e.g., by whispering), the response may be muted entirely.

The audio device may also adjust its output volume based on conditions or changes within an environment or space in which the user is located. For example, an audio device may change its output volume based on the detection of a second person entering the space, or upon detecting a conversation or a second person speaking in the space.

BRIEF DESCRIPTION OF THE DRAWINGS

FIGS. 1A and 1B are example audio devices in a user environment.

FIG. 6A is an example of volume level adjustments over time by an audio device based on interrupts received within a detection zone.

FIG. 6B is a second example of volume level adjustments over time by an audio device based on interrupts received within a detection zone

DETAILED DESCRIPTION

Figure 2:
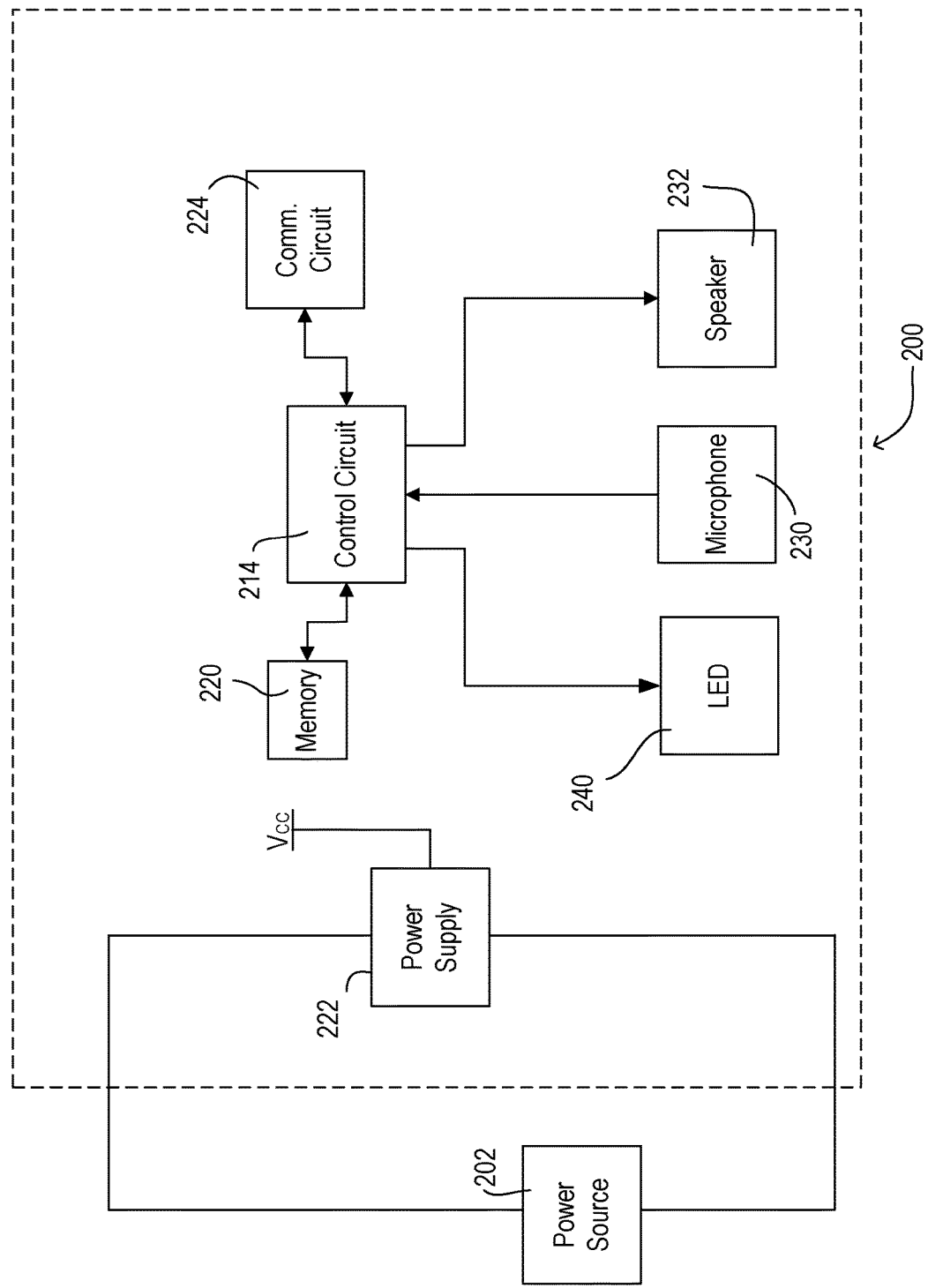
FIG. 2 is a block diagram of an example audio device.

Described herein is an audio device that intelligently adjusts its volume based on conditions within the environment in which the audio device is located. FIGS. 1A and 1B illustrate an example user environment, for example a room 100, in which a user 104 may interact with an audio device 102. The audio device 102 may be a voice integration device, such as a Google Home, Amazon Alexa, or other voice integration device. The audio device 102 may have at least one microphone and at least one speaker. A user 104 may interact with the audio device through verbal requests 108A, 108B. The audio device 102 may receive the verbal requests or voice commands 108A, 108B from the user 104 and may transmit acoustic data based on the voice commands to, for example, a remote server (such as a cloud-based server) on the Internet 130, for example, for acoustic processing. One will understand that alternatively, the audio device 102 may internally process the acoustic data and may not use the remote server for acoustic processing. After the acoustic data has been processed, the audio device 102 may then acoustically respond the user 104 by emitting audio signals (such as one or more verbal responses 110A, 110B), based on the acoustic processing.

The audio device 102 may transmit acoustic data to the remote cloud server on the Internet 130 via a wireless connection to a router 127. For example, the connection may be a Wi-Fi connection. Or, the audio device 102 may transmit acoustic data to the remote cloud server on the Internet 130 via a wired connection. For example, the audio device 102 may contain a wired Ethernet connection to the router 127. The router 127 may receive the acoustic data from the audio device 102 via the wired or wireless connection and transmit the acoustic data to the remote cloud server on the Internet 130.

In addition to, or alternative to, the wired and wireless connections previously described, the audio device may wirelessly transmit the acoustic data via a wireless protocol 115 to an intermediary device, such as a hub device 129. The hub device 129 may receive the acoustic data via the wireless protocol 115 from the audio device 102 and may further translate the acoustic data and send it to the router 127. The hub device 129 may communicate with the router 127 via a wired (i.e., Ethernet) or wireless connection. For example, the wireless protocol 115 of the audio device may be a standard wireless protocol (e.g., ZigBee, Wi-Fi, Z-Wave, Bluetooth, Li-Fi, Thread, etc.), or a proprietary protocol (e.g., the ClearConnect protocol).

The room 100 may include additional devices, such as sensors, transmitters, or other devices that monitor the space. For example, the room 100 may contain one or more occupancy sensors, such as occupancy sensor 120. The occupancy sensor 120 may be a passive infrared (PIR), microwave, ultrasonic, microphonic, or other type of occupancy sensor, or any combination of those aforementioned. The occupancy sensor 120 may be a wireless occupancy sensor which also uses the wireless protocol 115, or the occupancy sensor 120 may be a wired occupancy sensor. When a person enters the space, the occupancy sensor 120 may transmit an occupied signal to indicate that the room is occupied. The occupied signal may be received by the hub device 129, and/or any other device in the room, such as the audio device 102. For example, the occupancy sensor may periodically transmit an occupied signal while detecting occupancy. When the room is not occupied, the occupancy sensor may stop transmitting occupied signals and may additionally, or alternatively, transmit a vacancy signal indicating that the room is vacant. Examples of RF load control systems having occupancy and vacancy sensors are described in greater detail in commonly-assigned U.S. Pat. No. 8,009,042, issued Aug. 30, 2011, entitled RADIO-FREQUENCY LIGHTING CONTROL SYSTEM WITH OCCUPANCY SENSING; U.S. Pat. No. 8,199,010, issued Jun. 12, 2012, entitled METHOD AND APPARATUS FOR CONFIGURING A WIRELESS SENSOR; and U.S. Pat. No. 8,228,184, issued Jul. 24, 2012, entitled BATTERY-POWERED OCCUPANCY SENSOR, the entire disclosures of which are hereby incorporated by reference.

The occupancy sensor 120 may have a field of view. The field of view may be an area in which an occupant may be detected by the occupancy sensor 120. For example, a user within the occupancy sensor's field of view may be detected by the occupancy sensor, whereas a user that is not within the occupancy sensor's field of view may not be detected by the occupancy sensor. The field of view may be directed to specific areas (or zone) of the room, as indicated by the field-of-view lines 140. In this way, the occupancy sensor 120 may be responsive to a smaller zone of the room, where the zone is limited to specific portions or areas of interest in the room. For example, the field of view of the occupancy sensor 120 may be restricted to the area around the entrance 122 of the room 100.

The audio device 102 may be responsive to the occupancy signals of the occupancy sensor 120. That is, the audio device may modify its audio output based on the state of occupancy of the room. The audio device 102 may receive occupancy signals directly from the occupancy sensor 120, or indirectly through a network device, such as the hub 129. For example, the occupancy sensor 120 may send an occupancy signal to the hub 129, and the hub 129 may transmit a command to the audio device 102 to alert the audio device 102 that the area within the field of view 140 either is or is not occupied. This and other embodiments will be discussed in greater detail herein.

FIG. 2 is an example block diagram of an audio device 200, which may be similar to audio device 102 of FIG. 1. The audio device may be powered by a power source 202. The power source 202 may be any suitable alternating current (AC) or direct current (DC) power source. For example, the power source 202 may be an AC line voltage. Alternatively, the power source 202 may be a DC power source, such as a 12 or 42-volt (V) supply provided by low voltage wires, Power over Ethernet (PoE), one or more batteries, a solar cell, universal serial bus (USB), etc. The audio device may contain an internal power supply 222 which supplies a voltage $V_{CC}$ for powering the electronic circuitry of the audio device. The power supply 222 may be integrated with the audio device, or the power supply 222 may be provided as an AC-to-DC power supply adapter which may be used to connect the audio device to a wall receptacle, such as power source 202. Other examples are possible.

The audio device 200 may have a control circuit 214. The control circuit 214 may be powered by the voltage $V_{CC}$ provided by the power supply 222. The control circuit 214 may include one or more of a processor(s) (e.g., a microprocessor), a microcontroller(s), a programmable logic device(s) (PLD), a field programmable gate array(s) (FPGA), an application specific integrated circuit(s) (ASIC), or any suitable controller(s) or processing device(s).

The control circuit 214 may be adapted to receive audio signals from an input microphone 230. That is, the control circuit 214 may be in electrical communication with the microphone 230. The microphone 230 may receive acoustic input (such as request or commands 108A, 108B from a user) from the environment in which the audio device is located and may send electrical audio signals to the control circuit 214. The audio signal output by the microphone 230 may be an analog or a digital output. The microphone 230 may be a standalone microphone with external circuitry, or the microphone may be a single package such as a chip or daughterboard that includes an integrated amplifier. For example, the microphone may be a MEMS (Micro-Electro-Mechanical System) microphone. One example suitable microphone may be a MP45DT02-M MEMS audio sensor omnidirectional digital microphone, manufactured by STMicroelectronics. Alternatively, the microphone 230 may be an electret microphone, condenser microphone, or any other acoustic input device available, for example, in a suitably small package size.

The microphone 230 may represent multiple input microphones. For example, the microphone 230 may represent a microphone array, that is, a group of two or three or more microphones physically spaced apart from one another. Multiple input microphones may improve ambient noise rejection and provide acoustic beam-forming or beam-steering capability, whereby the audio device may be directionally sensitive to input sounds.

The audio device 200 may contain a communication circuit 224 which is operably connected to the control circuit 214. The communication circuit 224 may be a wireless communication circuit and may communicate (i.e., send and/or receive) acoustic data to an external device or network based on received audio signals processed by the control circuit. For example, the communication circuit 224 may send audio signals to a remote network for acoustic processing. The remote network may be located on a cloud server hosted on the Internet. The audio device may communicate to the remote network via one or more intermediary devices, such as a hub device and/or a router device. The communication protocol may include one or more of the following: Wi-Fi, ZigBee, Bluetooth, or any other protocol with sufficient bandwidth to transmit audio signals. The communication circuit 224 may also receive acoustic data that has been processed remotely from the sent audio signals and may send the acoustic data to the control circuit 214. Alternatively or additionally, the processing of received audio signals may occur within the audio device, such as by the control circuit.

The communication circuit 224 may also be a dual-frequency communication circuit, or may be multiple communication circuits. For example, the audio device may communicate on two different communication circuits using two different wireless communication protocols: a first communication protocol, such as Wi-Fi or Bluetooth; and a second communication protocol, such as Z-Wave, Clear-Connect, Thread, ZigBee, etc. The first and second communication protocols may be within the same or overlapping frequency bands. For example, the first communication protocol may be a Wi-Fi protocol and the second communication protocol may be a ZigBee protocol, where the Wi-Fi and ZigBee protocols operate in overlapping frequency bands around 2.4 gigahertz (GHz). Or, the first and second communication protocols may use different frequency bands. For example, the first communication protocol may be a Wi-Fi protocol at a frequency of 2.4 GHz, while the second communication protocol may be a Z-Wave, Clear-Connect, or other proprietary protocol which may use a sub-GHz frequency, for example, 434 megahertz (MHz). The audio device may use the first communication circuit/protocol to communicate with the Internet 130 for cloud-based audio processing, and use the second communication circuit/protocol to communicate with other devices in the space 100, such as additional audio devices, sensors (e.g., sensor 120), hubs or network devices (e.g., hub 129), lighting control devices, and the like.

Alternatively or additionally, the communication circuit 224 may be a wired communication circuit. For example, the communication circuit 224 may be operably connected to a Universal Serial Bus (USB) Type-C, Ethernet or Category 5 (Cat5), Serial, or any other type of communication cable or wire. For example, the audio device 200 may communicate using a wired communication link which complies with a Power over Ethernet or USB 3.0 standard.

The audio device 200 may further include a memory 220. The memory 220 may be in electrical communication with the control circuit 214. The memory may store software and/or firmware based instructions that are executed by the control circuit to provide functionality described herein. Additionally, the audio device 200 may store audio signals or acoustic data received by the control circuit 214 from the microphone 230 in the memory 220. For example, the memory 220 may act as a buffer for temporarily storing audio signals to be transmitted via the communication circuit 224 to a cloud server for acoustic processing. The memory may be a volatile memory, such as random-access memory (RAM). However, the memory may be a non-volatile memory, such as an electrically erasable read-only memory (EEPROM) or a non-volatile random-access memory (NVRAM).

The audio device may also include one or more speakers 232 coupled to the control circuit 214. The speaker 232 may provide audible communication and/or feedback to a user. For example, the speaker 232 may allow the audio device 200 to communicate audibly with a user, and/or the speaker may be used to play music, for example. The control circuit 214 may send audio signals to the speaker 232 to generate audio/acoustic output (such as responses 110A, 110B to a user). For example, the control circuit 214 may receive audio signals containing processed acoustic data from the communication circuit 224 and may send the audio signals to the speaker 232. The speaker 232 may then play the audio signals to a user. For example, the acoustic data received from the cloud server may be a response to a question asked by the user, and the control circuit 214 may be configured to send the acoustic data in the form of audio signals to the speaker 232 to acoustically transmit the answer to the user. The speaker may be any suitable transducer for receiving an audio signal containing acoustic data and transmitting an acoustic output. For example, the speaker 232 may be a magnetic, piezoelectric, or MEMS speaker, or any other type of speaker, including active speakers.

The audio device 200 may dynamically adjust the output volume of the speaker 232 based on conditions in the environment in which the audio device is located. For example, the audio device may adjust the output volume based on any one or more of: the volume level of the acoustic inputs (e.g., requests) received by the microphone 230 (i.e., the volume level of the received audio signals), the distance of the user or source of the acoustic input from the audio device, and the ambient background noise level.

Additionally, the audio device may include one or more light-emitting diodes (LEDs) 240. The LED 240 may be used to indicate a volume level of the speaker 232. Or, the LED 240 may be used to indicate when the audio device is in a privacy mode. For example, when a user places the audio device 200 into a privacy mode, the LED 240 may turn on. Alternatively, the LED 240 may be on during normal operation and may turn off when a user places the audio device 200 into the privacy mode. Although described here as an LED, one of ordinary skill in the art will recognize that any indicator may be used, including, but not limited to, an LED screen, etc.

The audio device 200 may include additional circuitry (not shown here) which may include, but is not limited to: actuators, load control circuitry, passive infrared occupancy sensing circuitry, microwave occupancy sensing circuitry, an ambient light sensor, and the like.

Figure 3:
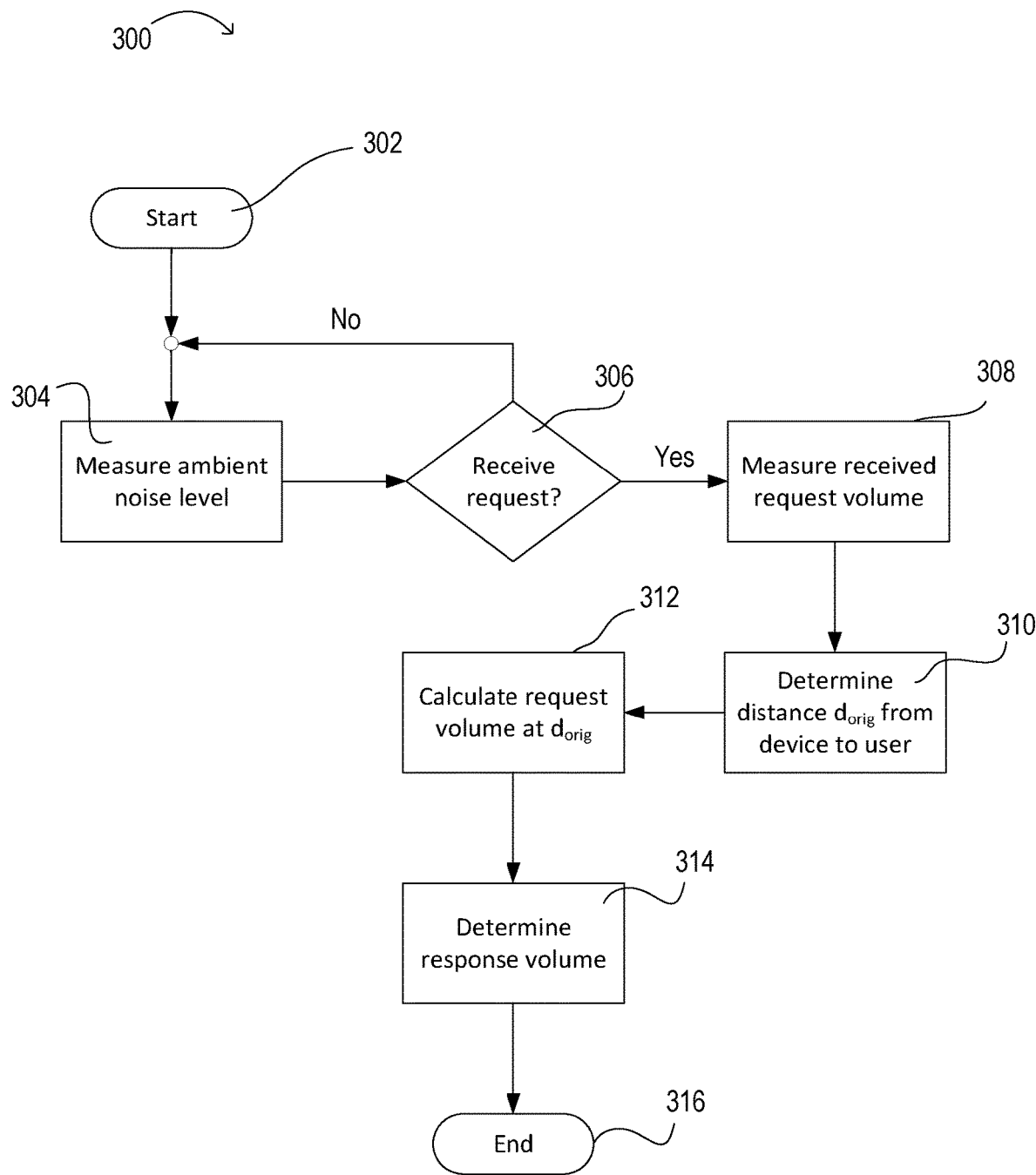
FIG. 3 is a flowchart of an example process for dynamically determining an audio response volume level based on the distance and volume level of a user request.

FIG. 3 is an example process 300 which may be performed by the control circuit of the audio device to dynamically determine a volume level to transmit/broadcast an audio output (e.g., a response such as response 110A, 110B) via the speaker 232 based on the distance between a source of an acoustic input from the acoustic device and a volume level of the acoustic input (e.g., a user request or command 108A, 108B) at the source. For description purposes, process 300 will be described with respect to an acoustic device receiving a request/command (as one example of acoustic input) and transmitting a response (as one example of acoustic output). One will understand the acoustic output may also include playing an audio track such as a song or podcast, an answer to a user's question, or a verbal acknowledgement that the keyword or wake word was identified. The method 300 may start at step 302. At step 304, the control circuit may measure the ambient noise level of the room. For example, the ambient noise level of the room may be the background sound pressure level, which may correspond to a voltage produced by the microphone or microphone array 230.

At step 306, the control circuit may determine whether an audio request has been received. The request may be identified by a preceding audio keyword, followed by a verbal request from a user. If a request has not been received, the audio device may continue to measure the ambient noise level at step 304. If the control circuit of the audio device determines that a request has been received at step 306, the control circuit may measure a volume level of the received request, i.e., the sound pressure level, at step 308. The volume level of the received request may be an average or root-mean-square (RMS) amplitude, i.e., the magnitude of the voltage over time, of one or a combination of the microphone outputs. The audio device may be calibrated such that the received volume from the microphone acoustic inputs may correlate to a known sound pressure level (SPL). That is, the microphone and/or the audio device may have a known receive sensitivity. The receive sensitivity may be used to calculate the sound pressure level based on the voltage output by the microphone, according to the following formula:

$$SPL_{meas} = 20 * \log_{10}(P/P_0) \text{ [dB]}$$

where $SPL_{meas}$ is the sound pressure level measured in decibels, P is the sound pressure incident on the microphone, and $P_0$ is a reference sound pressure. The reference sound pressure $P_0$ in air is generally considered to be 20 micropascals, although other values may be used. The receive sensitivity of the microphone may be used to convert the voltage measurement of the incident sound wave to the sound pressure P incident on the microphone according to the following formula:

$$P = V_{mic}/R_x \text{ [Pa]}$$

where $V_{mic}$ is the voltage measured by the microphone, and $R_x$ is the sensitivity of the microphone in volts per pascal. For example, for a microphone voltage $V_{mic}$ of 2 millivolts (RMS), and a microphone sensitivity $R_x$ of 4 millivolts per pascal, the pressure P incident on the microphone would be 0.5 pascals, with a corresponding SPL level of approximately 88 decibels.

At step 310, the control circuit may determine the distance $d_{orig}$ from the audio device 102 to the origin/source of the request at user 104, or person making the request. This may be done using a variety of different techniques. For example, assuming the acoustic device has a microphone array of three or more microphones, the control circuit may compare the received audio signals from at least two microphones of the microphone array with respect to the third microphone to determine the difference in the time of arrival of the audio signals. The difference in the time of arrival of the audio signals may indicate the angle at which the user is located with respect to the at least two microphones of the microphone array. For a microphone array of at least three microphones, the time of arrival may be used to calculate two unique angle determinations, wherein the difference in the calculated angles may be used to determine the distance $d_{orig}$ of the sound source (i.e., the distance between the user and the audio device). Techniques such as time-of-arrival and beam-forming or beam-steering are well-known in the art. A more detailed discussion on calculating the time delay or difference in time of arrival can be found in the August 1976 publication of IEEE Transactions on Acoustics, Speech, and Signal Processing, Volume ASSP-24, No. 4, by Charles H. Knapp et. al., entitled "The Generalized Correlation Method for Estimation of Time Delay", found on pages 320-327, which is hereby incorporated by reference in its entirety. Other examples are possible.

Although the methods described above rely on at least three microphones to calculate the distance $d_{orig}$, other methods are known which may require only a single microphone for the angle determination, and therefore two microphones for the distance calculation. For example, a single microphone may use an artificial pinna which may be characterized by a transfer function to transform the received sound according to the characterized transfer function. The received sound may be analyzed using the known transfer function of the artificial pinna to extract directional information from the acoustic input. In this way, the direction of the sound source from the user to the audio device may be calculated with a relatively small (less than 20 degrees) margin of error. A first microphone with an artificial pinna may be used with a second microphone with an artificial pinna to calculate two angles from the audio device to the sound source (i.e., the user), which angles may then be used to calculate the distance $d_{orig}$. Calculations of the incident sound angle using a single microphone and an artificial pinna are described in more detail in an article entitled "Learning Sound Location from a Single Microphone" by Ashutosh Saxena, et al., published May 12, 2009, by IEEE Press in the ICRA'09 Proceedings of the 2009 IEEE international conference on Robotics and Automation, pages 4310-4315, which is hereby incorporated by reference in its entirety. Other examples are possible Alternative to using a differential angle technique, a differential volume technique with two microphones may be used to determine distance $d_{orig}$. This technique is based on the phenomena that the discrepancy between the perceived volume at the two microphones decreases as the distance $d_{orig}$ increases.

The ability of the audio device to determine the distance $d_{orig}$ between the audio device and the sound source may be limited by the physical distance by which the microphones of the microphone array are spaced apart. That is, decreasing the distance between microphones may increase the error in the distance calculation. For example, any noise in the received acoustic input may slightly shift the perceived time of arrival of the audio signal and therefore the calculated distance $d_{orig}$. For example, a separation of 1.6 centimeters (approximately a half-inch) between two microphones of a microphone array may be too close to accurately calculate distance $d_{orig}$. A separation distance of 3.1 centimeters (approximately one inch) may be able to discriminate between a $d_{orig}$ (that is, a user located a distance $d_{orig}$ from the audio device) less than or equal to 10 centimeters from a $d_{orig}$ greater than 10 centimeters. A separation of 6 centimeters between microphones may increase the distance $d_{orig}$ which may be accurately resolved to about 1 meter, or approximately three feet.

Although these techniques described herein for measuring distance between the audio device and the sound source are specific to acoustic measurements with microphones, one skilled in the art will recognize that any other suitable techniques for determining distance between two objects may be used. For example, this may include, but is not limited to: infrared or microwave radar, ultrasonic doppler radar, etc.

Once the control circuit has determined the distance between the sound source and the audio device, the control circuit may calculate the volume (i.e., SPL) of the audio request at the origin (i.e., $d_{orig}$, the location of the user from the audio device) using the distance $d_{orig}$ and the measured received-request volume at step 312. As SPL decreases over distance due to the spreading of the acoustic waves and acoustic transmission losses, a greater distance between the user and the audio device will result in a greater reduction in SPL from the request volume at the origin (i.e., at the user) and the request volume measured by the audio device.

The SPL at the origin ($SPL_{orig}$) may be approximated according to the following formula:

$$SPL_{orig} = SPL_{meas} + 20 \log_{10}(d_{meas}/d_{orig}) \text{ [dB]}$$

where $d_{meas}$ is 30 centimeters, the reference distance for measuring SPL according to the industry standard SPL measurement. For example, for a user located at a distance $d_{orig}$ of 60 centimeters (i.e., approximately two feet) from the audio device, and a received $SPL_{meas}$ of 20 decibels, the SPL at the origin $SPL_{orig}$ is approximately 26 decibels. The SPL decreases by approximately 6 decibels for each doubling of distance. For example, a user standing six meters from the audio device (i.e., approximately 20 feet), speaking at an SPL of 46 decibels, would generate the same $SPL_{meas}$ as a user standing 30 centimeters from the audio device and speaking at a level of 20 dB. That is, the user standing twenty feet from the audio device may need to speak more than 20 dB louder than the user standing two feet from the audio device in order to generate an equivalent SPL.

At step 314, the audio device may use the calculated received-request volume $SPL_{orig}$ at $d_{orig}$ to determine the appropriate SPL, i.e., volume level, at which to transmit/broadcast the audio output (according to this example, the response). The response volume level may be based on the measured ambient noise and the request volume at $d_{orig}$. At step 316, the process may end, and the audio device may broadcast the response to the user at the calculated response volume.

Figure 4:
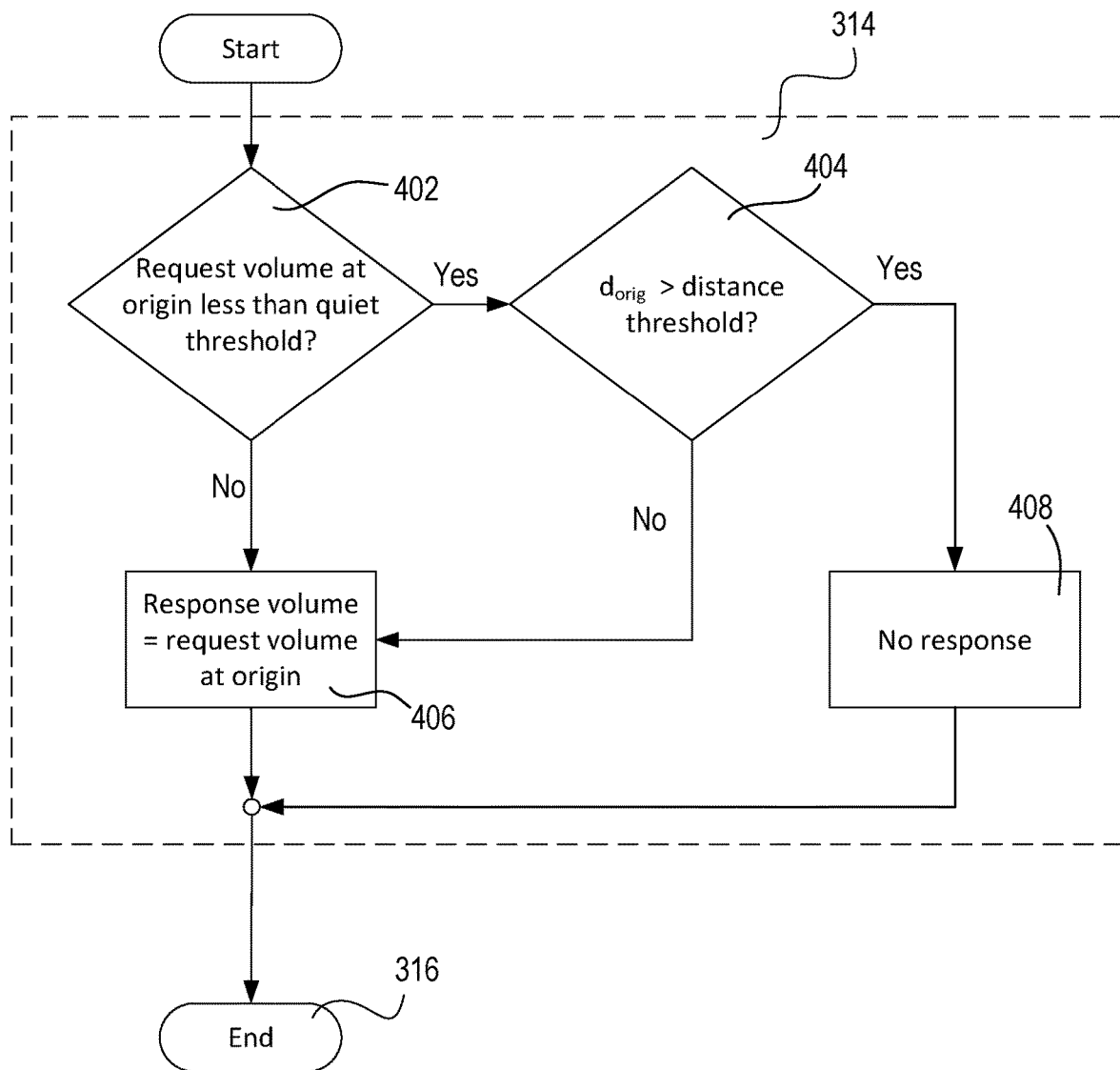
FIG. 4 is a detailed example flowchart of step 314 of FIG. 3 displaying how the audio device may determine response volume.

An example process for determining the response volume of step 314 is shown in more detail in FIG. 4. At step 402, the control circuit may determine whether the volume level of the request at $d_{orig}$ ($SPL_{orig}$) is below a quiet threshold. The quiet threshold may be the maximum volume level which may be considered a quiet conversation. For example, for a typical room, the quiet threshold may be set to a value within the range of 20 to 30 decibels (dB).

The quiet threshold may be a static threshold selected by a user. For example, a user may set a quiet threshold of 25 dB.

Alternatively, the quiet threshold may be a dynamic threshold. For example, audio device may measure or calculate the quiet threshold based on the ambient or background noise level of the room and may be updated over time as the ambient noise level changes. For example, the background noise level may periodically, or continuously, measured by the microphone of the audio device and used to adjust the quiet threshold. That is, when the ambient noise level of the room exceeds the quiet threshold, the quiet threshold may be adjusted based on the ambient noise level of the room. For example, for a room with an ambient noise level of 40 dB, a quiet conversation may be slightly higher than the noise level, for example, within a range of approximately 42-50 dB. In this case, the quiet threshold may be set to 50 dB. One will recognize that these are example values and other threshold values may be used.

If the control circuit determines at step 402 that the request volume is below the quiet threshold (i.e., the user has whispered a request), the method may proceed to step 404. The control circuit may determine at step 404 whether the distance between the user and the audio device exceeds a distance threshold. The distance threshold may indicate a distance where the user is in close proximity to the audio device. For example, the distance threshold may be set to approximately one meter. If the control circuit determines that the user is located at a distance $d_{orig}$ from the audio device which exceeds the distance threshold, the control circuit may determine at step 408 not to transmit a response to the user because the volume may be too low for the user to hear at that distance. Alternatively, the control circuit may be configured to transmit the response at the same volume as the request at the origin, $d_{orig}$.

If the control circuit determines that the user is located within the distance threshold, (i.e., that $d_{orig}$ is less than, or does not exceed, the distance threshold) at step 406 the control circuit may set the response volume equal to the volume of the request at the origin. For example, a user 104 may whisper a request 108A to the audio device 102 (as shown in FIG. 1A). If the volume level of the request 108A is below the quiet threshold and the user is proximate the device (that is, the distance between the user and the audio device is less than the distance threshold), then the audio device may respond to the user using a whisper volume level, i.e., the audio device may match the volume level of the user's request. For example, when the user 104 whispers a request at 25 dB, so as not to disturb another person, such as user 106, who may be sleeping in the room 100, the audio device 102 may match the volume level of the request and respond with a speaker output of 25 dB.

In a second example, if the user were to whisper a request 108A while the user is located across the room, as shown in FIG. 1B, the control circuit of the audio device may determine that the request volume at the origin $SPL_{orig}$ is below the quiet threshold at step 402. However, the distance $d_{orig}$ between the user and the audio device may now be greater than the distance threshold. In this case, the control circuit of the audio device may process the command given by the user, but the audio device may not respond with a verbal response. For example, a user 104 may whisper across the room to tell the audio device to turn off the lights. The audio device 102 may then adjust the lights in the room 100, but refrain from broadcasting a verbal response, such as acknowledgement that the request was executed or not. In this way, the audio device may intelligently adjust the volume of the audio response so as not to disturb other persons in the room.

In another example, the user 104 may speak a request 108B to the audio device 102. The request 108B may be at a volume level that is above the quiet threshold at step 402. In this case, the control circuit of the audio device may respond to the user 104 at a response volume which matches the request volume (step 406). For example, if a user is speaking loudly (e.g., with an SPL above a "normal" conversation tone), the audio device may respond loudly to the user using the same SPL. This response mechanism may be advantageous for a space shared by multiple users where one of the users has a hearing impairment. In this way, both the user with the hearing impairment and the other users in the room 100 may interact with the audio device 102 without the need for manually adjusting the volume output of the audio device 102. At step 316, the method may end.

In addition to that described above, a user may provide instructions to an audio device on how to respond to certain requests. For example, a user may instruct the audio device not to provide a verbal acknowledgement after a user makes a request. Based on receiving the instruction given by the user, the audio device may not provide a verbal acknowledgement for every request received from a user. Alternatively, a user may instruct the audio device not to provide a verbal acknowledgement only for certain requests received from a user, such as, for example, lighting control commands. A user may instruct the audio device to not provide an acknowledgement through a mobile application setting for the audio device, a verbal command, a button press, or the like.

Figure 5:
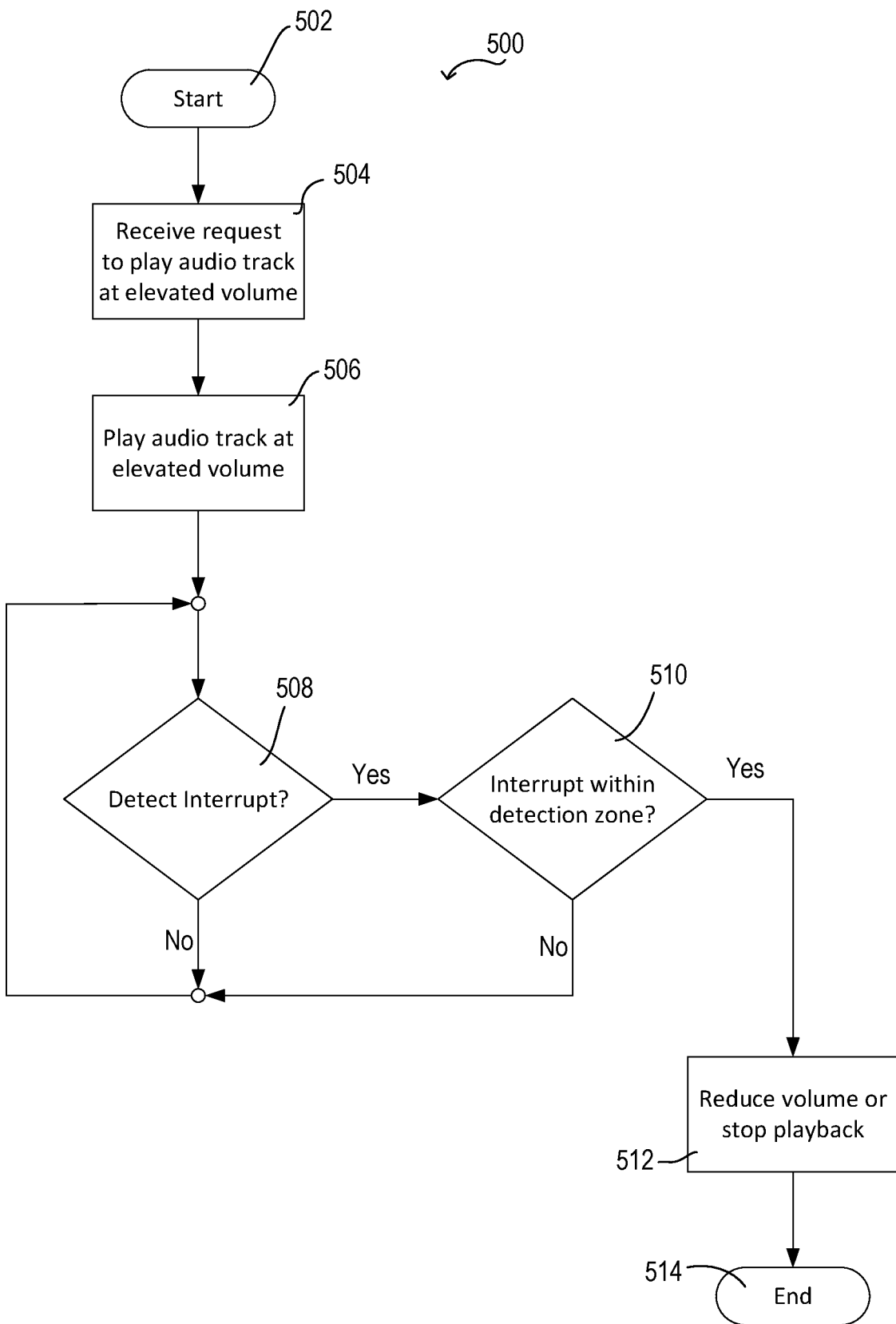
FIG. 5 is a flowchart detailing an example process for an audio device to determine how to respond to an interruption while playing an audio track.

FIG. 5 is a flowchart of an example process 500 which may be implemented by the control circuit 214 of the audio device 200 to detect and determine how to respond to an interruption while the audio device 200 is playing an acoustic output (such as an audio track) at an elevated volume. An interruption, or interrupt, may be a change in the room or environment which may further cause a user to want to pause the audio track, for example, an acoustic input such as a person speaking. The audio device may be configured to detect different types of interrupts, as will be described in further detail below, and based on the detection, determine whether or not to pause the audio track.

The process may begin at step 502. At step 504, the control circuit may receive a request, for example, to play an audio track at an elevated volume. The request to play the audio track at the elevated volume level may be a verbal request by a user. For example, a user may speak a keyword or phrase to engage the elevated volume mode. In response to the request, the control circuit may increase the output volume level of the speaker to the elevated volume at step 506. For example, the audio device may already be playing an audio track at the start of the method in step 502, where the user may request an elevated volume level at 504. At step 506, the audio device may increase the volume of the audio track currently being played, or may start playing a subsequently requested the audio track at the requested elevated volume level.

At step 508, the control circuit may determine whether an interrupt has been detected. For example, an interrupt may be an acoustic interrupt, i.e., an acoustic input received while the audio device is playing an audio output. Acoustic interrupts may be detected while the audio device is playing an audio track, for example, by using noise-cancelling techniques to remove the known audio track output from the acoustic input recorded by the microphone. This processing may be done by the control circuit, which may subtract out the received acoustic input at the microphone input from the audio signal sent to the speaker for transmitting the acoustic output audio track. Alternatively, the processing may be done on a remote cloud server on the Internet.

Alternatively, the interrupt may be a non-acoustic signal detected by the audio device and/or one or devices in the room in communication with the audio device. For example, the interrupt may be an occupancy detection signal, e.g., that a person has entered the space. The audio device may detect occupancy. For example, the audio device may contain an occupancy sensor, such as a passive infrared (PR), microwave, image-based, or ultrasonic occupancy sensor. Or, there may be an occupancy sensor within the room or space, such as occupancy sensor 120 of FIG. 1, which may detect occupancy and transmit an occupancy command/signal based on the detected occupancy. The occupancy command may be received by the audio device 102. Alternatively, or additionally, the occupancy command may be received by the hub device 129, and the hub device 129 may transmit the occupancy command to the audio device 102.

The interrupt may alternatively be a sound. For example, the interrupt may be a cellphone ringing, a doorbell, knocking, a user speaking, a door opening, etc. When the audio device detects an interrupt, the audio device may determine at step 510 whether the interrupt signal was within a detection zone. A detection zone may be specified by a user and may be measured by the audio device or one or more devices within the space. For example, a detection zone may be an occupancy detection zone, such as field of view 140 shown in FIG. 1.

Alternatively, the detection zone may be an acoustic detection zone. For example, the detection zone may be created through acoustic beamforming, where the audio device may compare audio signals received from acoustic input in different areas or zones of a space. Beamforming relies on the difference in time of arrival between audio signals received from multiple microphones in a microphone array, and is well-known by those of ordinary skill in the art. The use of beamforming with a microphone array is described in more detail in U.S. Pat. No. 7,415,117, entitled "SYSTEM AND METHOD FOR BEAMFORMING USING A MICROPHONE ARRAY", issued Aug. 19, 2008, to inventors Ivan Tashev and Henrique Malvar, which is hereby incorporated by reference in its entirety. Other examples are possible.

A user may configure the detection zone as an area of interest for receiving interrupts, either audio, occupancy, or otherwise. For example, a user may set up an occupancy detection zone by restricting the field of view of the occupancy sensor to the desired occupancy detection zone. For example, a user may physically mask off a portion of a PIR occupancy sensor lens to restrict the field of view of the sensor to the desired occupancy detection zone. In another example, a digital mask may be applied to an image occupancy sensor. Examples of digital masks are described in more detail in U.S. Patent Publication No. 20170171941, published Jun. 15, 2017 entitled LOAD CONTROL SYSTEM HAVING A VISIBLE LIGHT SENSOR, which is hereby incorporated by reference in its entirety.

A user may use a graphical user interface (GUI) on a mobile application to set up the detection zone or area of interest. For example, for detection zones created by acoustic beamforming, the mobile application may transmit the update to the audio device, and the audio device may configure acoustic beamforming based on the detection zone update received from the mobile application. A room may have a single detection zone or multiple detection zones. A detection zone may span the entire area of the room, or one or more subareas of the room. For example, a room may have a first detection zone around a doorway or entrance to the room. The room may further have a second detection zone at a second entrance to the room. The first and second detection zones or subareas may be distinct from each other, that is, the first and second detection zones may not overlap. For example, alternatively to PIR and image occupancy sensors, which may require areas to be physically or digitally masked, the room may comprise one or more door sensors configured to detect persons entering and/or exiting through the doorway. For example, the door sensors may be microwave, PIR, ultrasonic, visible light sensors, etc., with a field of view directed towards the doorway of the sensor rather than the interior of the room. In this example, the field of view of the sensor (i.e., the doorway) may be a first detection zone, while the rest of the room that is not within the first detection zone may be considered a second detection zone. Alternatively, door sensors may include pressure mats, infrared beams, etc.

As previously described, an interrupt may be occupancy detection, or the interrupt may be detection of audio within an area (i.e., via acoustic beamforming). If the audio device determines at step 510 that the interrupt has occurred within the detection zone (i.e., any of the interrupts as previously described), the audio device may then change the output of the speaker at step 512. For example, the audio device may either reduce the volume or pause the audio track playback.

The audio device may ignore interrupts and inputs from an area that is not within the detection zone. For example, if the audio device determines at step 510 that the interrupt was not located within the detection zone, the audio device may ignore the interrupt and continue to monitor the room for additional interrupts at step 508. For example, a user may sing along to an audio track outside of the one or more detection zones without the audio device modifying its volume or pausing the audio playback. At step 514 the method may end.

The interrupts described herein may be in addition to keyword detections by the audio device. For example, if a user were to speak the keyword to the audio device while the user is not located in a detection zone, the audio device may still respond to the user by reducing the volume of the audio track, or stopping or pausing playback of the audio track, in order to more clearly communicate with the user.

FIGS. 6A and 6B show examples of volume level adjustments 600A, 600B over time by an audio device based on interrupts received within a detection zone. For example, at time 602, the audio device may begin playing an audio track at volume level V1 in a first mode. The volume level V1 may be a standard, default, or system volume.

At time 606, the audio device may pause the playback or decrease the volume level to a request volume level V3 in response to hearing the keyword. The volume level V3 may be a "duck-out" volume, that is, a temporary reduced volume level during which the audio device receives a command following the recognition of the keyword or wake word. The audio device may maintain the audio output at the decreased volume level V3, or remain in the paused playback state, while the audio device receives the command from a user after the keyword has been identified. The command may include a request to enter a second mode, referred to herein as a "jam mode" for description purposes, whereby the audio device may increase the volume of the speaker output relative to the volume in the first mode.

After receiving the request to enter the second mode, the audio device may then increase the volume to V2 at time 610. The audio playback may then resume at the new volume level V2. The volume level V2 may be specified by the user, either at the time of the request, or may be recalled as a preset volume level from a previous setting or request. Alternatively, the second mode volume level may be adapted and learned over time by user adjustments to the volume level V2. Or, the volume level V2 may be increased by a predefined increment from the default or standard volume level V1. For example, the volume level V2 may be six dB louder than the volume level V1.

After detecting an interrupt, for example, in response to detecting a person entering the room, based on a signal received from an occupancy sensor (such a sensor 120), at time 614A, the audio device may either pause the audio playback, or reduce the volume to the first mode volume level V1. For example, a second person may enter the room in a detection zone, triggering the audio device to change modes from the second mode back to the first mode, thereby reducing the speaker output volume back to the original volume setting, or stopping or pausing the playback. The audio device may continue to play the audio track at the standard volume setting V1 in the first mode until receiving a request to change the setting. For example, the audio device may receive a request to increase the volume back to volume level V2 in the second mode, or may receive a request to stop playing the audio track. In another example, the audio device may remain at the reduced volume setting V1 as long as the detection zone remains occupied, and return to the previous volume setting V2 (i.e., increasing the volume level) when the detection zone becomes vacant. Alternatively, the audio device may remain at volume setting V1 for a time period and may return to volume level V2 after the time period has expired. For example, the time period may be a timeout time period specified by a user.

The audio device may further reduce the volume to the request volume level V3, or stop the audio playback, upon hearing the keyword at time 620. The audio device may then interact with (i.e., verbally respond to) the user at the decreased volume level V3. Once the audio device has finished audibly interacting with the user, the audio device may resume audio playback at the standard volume level V1 at time 624.

Alternatively, as shown in FIG. 6B, the audio device may enter the second mode at time 610 at the elevated volume level V2. At time 614B, the audio device may pause the audio playback or reduce the volume level to the request volume level V3 in response to receiving a request during the second mode. For example, the audio device may reduce the output volume of the speaker from the volume level V2 to the volume level V3 in response to receiving a request from an occupant or user in the room, or in response to a second person speaking. In addition to these examples, the audio device in the second mode may respond as shown at either time 614A or time 614B upon receiving any other interrupt, as previously described. More generically, one will understand that the audio device may reduce the volume level upon detection of an interrupt from a first volume level to a second reduced volume level. For example, it is not necessary that the first volume level be limited to an "elevated" volume level, but rather, the first volume level may be a "normal" volume level that is further reduced upon detection of an interrupt.

Additionally and/or alternatively, the audio device may only be responsive to reducing volume output in response to an interrupt when the audio output volume is over a certain threshold. For example, when the first volume level is a "normal" volume level (as opposed to an "elevated" volume level, i.e., below an "elevated" volume level threshold), in response to detecting an interrupt, the audio device may compare the audio output volume level to the volume level threshold. Based on the comparison, the audio device may determine that the first volume level is below the volume threshold, and based on the determination, may maintain the volume output at the first volume level (i.e., not drop the output volume in response to detecting an interrupt).

Additionally, although the audio device has been described herein as containing both at least one microphone and at least one speaker, one of ordinary skill in the art will readily understand that these concepts are not limited to a single device. For example, the speaker and microphone may be located in separate devices that are remote from each other, but which may communicate with each other, either directly, or indirectly via an intermediary device such as a hub device.

What is claimed is:

1. A device comprising:
   a microphone;
   a speaker; and
   a control circuit operably coupled to the microphone, the control circuit configured to:

play an audio track at the first volume level via the speaker;
receive a request via the microphone to play the audio track at a second volume level greater than the first volume level;
in response to the request, increase a volume level of the speaker from the first volume level to the second volume level and continue to play the audio track at the second volume level via the speaker;
detect an interrupt within a detection zone;
compare the second volume level to a threshold in response to the detection of the interrupt within the detection zone;
determine, based on the comparison, whether the second volume level is above or below the threshold; and
based on the determination that the second volume level is above the threshold, reduce the second volume level to the first volume level and continue to play the audio track at the first volume level; and
based on the determination that the second volume level is below the threshold, maintain the volume level at the second volume level.

2. The device of claim 1, further comprising a communication circuit, wherein to detect an interrupt comprises receiving an occupancy signal via the communication circuit.

3. The device of claim 1, further comprising an occupancy sensor coupled to the control circuit, wherein to detect an interrupt comprises receiving an occupancy signal from the occupancy sensor.

4. The device of claim 1, wherein the first volume level is zero.

5. A device comprising:
a microphone; and
a control circuit operably coupled to the microphone, the control circuit configured to:
cause a speaker to play an audio track at a first volume level;
receive a request from the microphone to play the audio track at a second volume level greater than the first volume level;
in response to the request, cause the speaker to increase a volume level from the first volume level to the second volume level and continue to play the audio track at the second volume level;
detect an interrupt within a detection zone;
compare the second volume level to a threshold in response to the detection of the interrupt;
determine, based on the comparison, whether the second volume level is above the threshold; and
based on the determination that the second volume level is above the threshold, cause the speaker to reduce the second volume level to the first volume level and continue to play the audio track at the first volume level.

6. The device of claim 5, wherein to detect an interrupt within a detection zone comprises receiving an occupancy signal from an occupancy sensor.

7. The device of claim 5, wherein the request is generated by a first user, and wherein to detect an interrupt comprises receiving an acoustic input from a second user.

8. The device of claim 5, wherein the second volume level is a preset volume level.

9. The device of claim 5, wherein the second volume level is specified by a first user.

10. The device of claim 5, wherein the second volume level is approximately six dB greater than the first volume level.

11. A device comprising:
a microphone;
a speaker having an audio output characterized by a first volume level; and
a control circuit operably coupled to the microphone, the control circuit configured to:
receive a signal indicating occupancy within a detection zone;
in response to the signal indicating occupancy, compare a volume level of the audio output of the speaker to a threshold;
determine, based on the comparison, whether the volume level is above or below the threshold;
based on the determination that the volume level is above the threshold, reduce the volume level from the first volume level to a second volume level; and
based on the determination that the volume level is below the threshold, maintain the volume level at the first volume level.

12. The device of claim 11, further comprising a communication circuit, wherein to receive the signal indicating occupancy comprises receiving a wireless occupancy signal from an occupancy sensor via the communication circuit.

13. The device of claim 11, further comprising an occupancy sensor coupled to the control circuit, wherein to receive the signal indicating occupancy comprises receiving an occupancy signal from the occupancy sensor.

14. The device of claim 11, wherein the control circuit is further configured to subsequently change the volume level of the audio output back to the first volume level based upon a condition.

15. The device of claim 14, wherein the condition is not receiving an occupancy signal during a timeout period.

16. The device of claim 14, wherein the condition is to receive a signal indicating vacancy.

17. The device of claim 5, wherein the control circuit is further configured to:
determine, based on the comparison, that the output volume level is below the volume threshold; and
based on the determination, cause the speaker to maintain the volume level at the second volume level and continue to play the audio track at the second volume level.

18. The device of claim 5, wherein the control circuit is further configured to:
detect that the interrupt is no longer within the detection zone; and
in response to detecting the interrupt is no longer within the detection zone, cause the speaker to increase the first volume level to the second volume level and continue to play the audio track at the second volume level.

* * * * *